United States Patent [19]

Takikawa

[11] Patent Number: 4,958,203
[45] Date of Patent: Sep. 18, 1990

[54] HIGH ELECTRON MOBILITY TRANSISTOR

[75] Inventor: Masahiko Takikawa, Yokohama, Japan

[73] Assignee: Fujitsu Limited, Kawasaki, Japan

[21] Appl. No.: 115,925

[22] Filed: Nov. 2, 1987

[30] Foreign Application Priority Data

Oct. 31, 1986 [JP] Japan ................... 61-258147

[51] Int. Cl.$^5$ ............................. H01L 29/80
[52] U.S. Cl. ............................. 357/22; 357/16
[58] Field of Search ........... 357/60, 16, 22 MD, 22 A

[56] References Cited

U.S. PATENT DOCUMENTS

| | | | |
|---|---|---|---|
| 4,705,361 | 11/1987 | Frazier | 357/16 |
| 4,734,750 | 3/1988 | Okamura | 357/16 |
| 4,745,447 | 5/1988 | Chen | 357/16 |

FOREIGN PATENT DOCUMENTS

| | | |
|---|---|---|
| 0033037 | 12/1980 | European Pat. Off. . |
| 0131379 | 1/1985 | European Pat. Off. ...... 357/22 MD |
| 140167 | 8/1983 | Japan . |
| 59-63768 | 4/1984 | Japan . |

OTHER PUBLICATIONS

Sze, S. M. "Physics of Semiconductor Devices", 1981, John Wiley & Sons, New York, p. 848.
Y-D. Zheng, et al., "Observation of a Quasi-Two-Dimensional Electron Gas at an InSb/CdTe," pp. 1187–1189, Applied Physics Letters, Nov. 3, 1986, No. 18, New York.
R. G. Van Welzenis et al., "Band Bending at the InSb-CdTe Interface", pp. 1057–1063, Solid-State Electronics, vol. 28, No. 11, Nov. 28, 1985, New York.
Phillipp G. Kornreich et al., "Proposed Size-Effect High-Electron-Mobility Transistor," pp. 421–428, Solid-State Electronics, vol. 29, No. 4, Apr. 15, 1985, New York.
Hunihiko Kodama et al., "Two-Dimensional Electron Gas at GaAs/Ga$_{0.52}$In$_{0.48}$P Heterointerface Grown by Chloride Vapor-Phase Epitaxy," pp. L127–L129, Japanese Journal of Applied Physics, vol. 25, No. 2, Part 2, Feb. 25, 1986, Japan.
Hilmi Unlu et al., "Band Discontinuities as Heterojunction Device Design Parameters," pp. 616–619, IEEE Transactions on Electron Devices, vol. ED-33, No. 5, May, 1986.

*Primary Examiner*—Andrew J. James
*Assistant Examiner*—Courtney A. Bowers
*Attorney, Agent, or Firm*—Staas & Halsey

[57] ABSTRACT

A high electron mobility transistor comprises a semiinsulating substrate, an undoped channel layer formed on the semiinsulating substrate and made of undoped gallium arsenide (GaAs), a doped carrier supplying layer formed on the undoped channel layer and made of a II-VI family compound semiconductor having an electron affinity smaller than that of the undoped gallium arsenide and having an energy gap greater than that of the undoped gallium arsenide, and source, drain and gate electrodes formed on the doped carrier supplying layer.

4 Claims, 2 Drawing Sheets

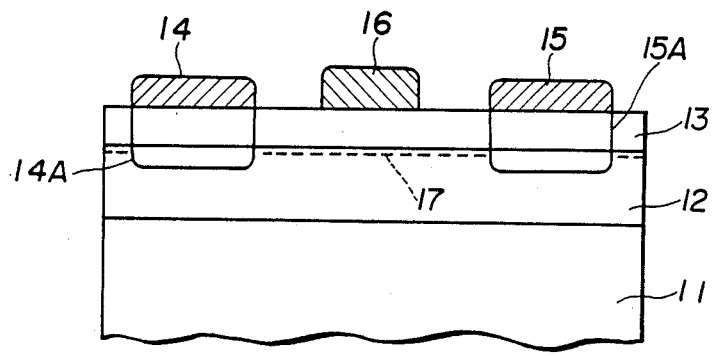
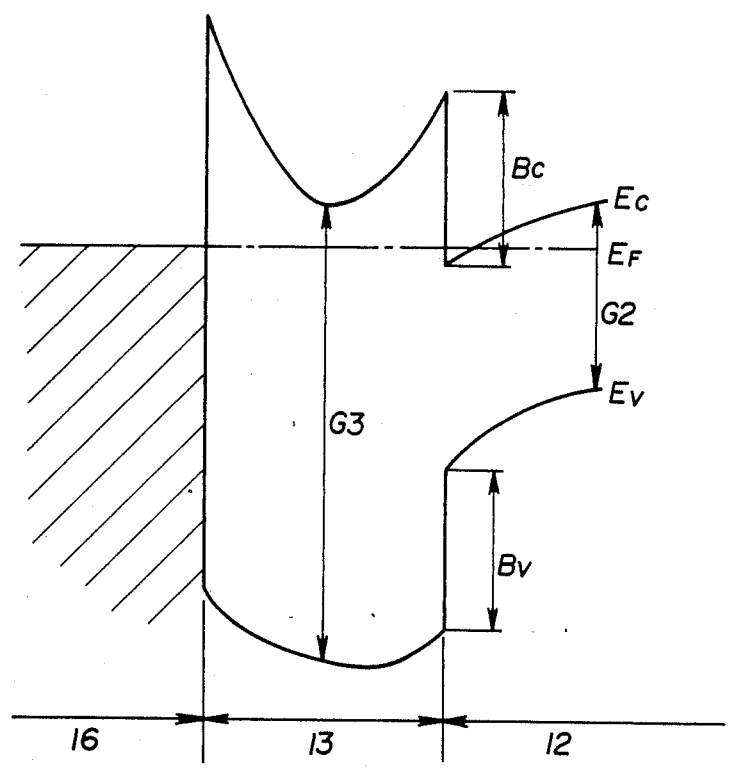

HIGH ELECTRON MOBILITY TRANSISTOR

BACKGROUND OF THE INVENTION

The present invention generally relates to high electron mobility transistors, and more particularly to a high electron mobility transistor which uses as a channel a two dimensional electron gas layer formed in a vicinity of a hetero interface.

Conventionally, a high electron mobility transistor (hereinafter simply referred to as a HEMT) is known as a high-speed field effect transistor. The HEMT generally comprises a semiinsulating gallium arsenide (GaAs) substrate, an undoped (or intrinsic) GaAs channel layer formed on the semiinsulating GaAs substrate, and an n-type aluminum gallium arsenide (AlGaAs) carrier supplying layer. A two dimensional electron gas layer formed in a vicinity of a hetero interface on the side of the undoped GaAs channel layer is used as the channel between a source and a drain. The density of two dimensional carrier gas in the two dimensional electron gas layer is controlled by a voltage applied to a gate which is formed on the n-type AlGaAs carrier supplying layer. In addition to the combination of GaAs having a large electron affinity and AlGaAs having a smaller electron affinity, the combination may be GaAs and indium gallium phosphide (InGaP), indium gallium phosphide (InGaAs) and indium phosphide (InP), or indium gallium arsenide (InGaAs) and indium aluminum arsenide (InAlAs).

According to the conventional HEMT, the energy difference between the conduction bands of GaAs and $Al_xGa_{1-x}As(x=0.3)$ is approximately 0.2 eV and is extremely small. Even in the case of the combination of GaAs and InGaP, the energy difference between the conduction bands is approximately 0.4 eV and is not much larger.

Generally, when the energy difference between the conduction bands is small, a known phenomenon occurs wherein the carriers accelerated in the two dimensional electron gas layer are transferred to the carrier supplying layer and the carrier mobility becomes low. This phenomenon is referred to as the real space carrier transfer to carrier supplying layer. Therefore, when the energy difference between the conduction bands is large, the carriers in the two dimensional electron gas layer are prevented from moving into the carrier supplying layer even when there is a high voltage applied across the drain and source. For this reason, the HEMT can operate stably even when a high voltage is applied across the drain and source. On the other hand, the density of the two dimensional carrier gas in the two dimensional electron gas layer of the HEMT is proportional to the energy difference between the conduction bands. Consequently, the larger the energy difference is between the conduction bands, it is possible to obtain a larger current output.

The Japanese Laid-Open Patent Application No. 58-140167 discloses a HEMT wherein undoped InGaAs, indium gallium arsenide phosphide (InGaAsP) or the like is used as the channel layer and doped InGaAsP, zinc selenide (ZnSe) or the like is used as the carrier supplying layer. According to this previously proposed HEMT, it is possible to obtain a large energy difference between the conduction bands compared to that obtainable in the conventional HEMT described before. However, because the channel layer is a three-element or four-element layer, there are problems in that scattering of alloy occurs at a low operation temperature, and the carrier mobility becomes low. For example, when undoped InGaAs is used as the channel layer and doped InAlAs is used as the carrier supplying layer, it is only possible to obtain a carrier mobility $\mu$ in the order of $5 \times 10^4$ cm²/Vsec to $6 \times 10^4$ cm²/Vsec at a temperature of 77° K. On the other hand, the carrier mobility $\mu$ obtainable in the conventional MEHT using undoped GaAs as the channel layer and doped AlGaAs as the carrier supplying layer is in the order of $10^5$ cm²/Vsec to $2 \times 10^{15}$ cm²/Vsec at the temperature of 77° K.

That is, in the case where the channel layer is made of a three-element compound semiconductor, the carrier mobility is low compared to the case where the channel layer is made of a two-element compound semiconductor. Accordingly, in the HEMT having the InGaAs channel layer and the ZnSe carrier supplying layer, the effect of preventing the real space carrier transfer to carrier supplying layer is small even when the energy difference between the conduction bands is large.

SUMMARY OF THE INVENTION

Accordingly, it is an object of the present invention to provide a novel and useful high electron mobility transistor in which the problems described heretofore are eliminated.

Another and more specific object of the present invention is to provide a high electron mobility transistor in which a channel layer is made of undoped (intrinsic) GaAs and a carrier supplying layer is made of a II-VI family compound semiconductor which will make lattice matching with the undoped GaAs channel layer. According to the high electron mobility transistor of the present invention, it is possible to obtain a large energy difference between the conduction bands of the channel layer and the carrier supplying layer. For this reason, the carriers in a two dimensional electron gas layer will not move into the carrier supplying layer even when a large voltage is applied across the drain and source, and the stable operation of the high electron mobility transistor is ensured. Further, it is possible to obtain a large current output since the density of the two dimensional carrier gas in the two dimensional electron gas layer is high. In the case where the channel layer consists only of two elements, there is no scattering of alloy in a cooling stage of the production process, and the carrier mobility is high compared to the previously proposed high electron mobility transistor.

Other objects and further features of the present invention will be apparent from the following detailed description when read in conjunction with the accompanying drawings.

BRIEF DESCRIPTION OF THE DRAWINGS

FIG. 1 is a cross sectional view showing an embodiment of the high electron mobility transistor according to the present invention;

FIG. 2 is an energy band diagram of the best mode of the embodiment of the high electron mobility transistor shown in FIG. 1.

DETAILED DESCRIPTION OF THE PREFERRED EMBODIMENT

Figure 3:
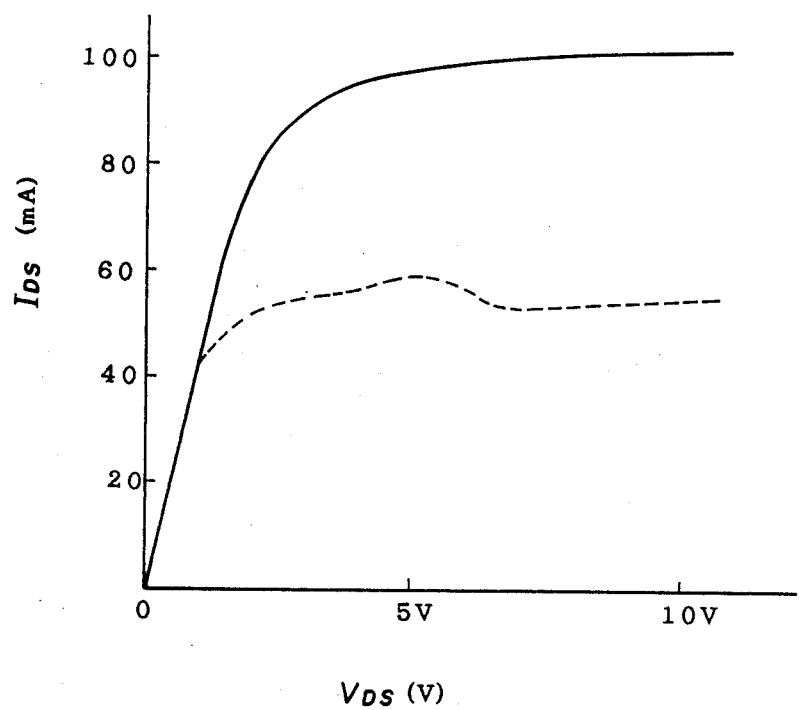
FIG. 3 is a graph of drain-source voltage versus drain-source current characteristic of the best mode of the embodiment shown in FIG. 1.

FIG. 1 is a cross section of an embodiment of the high electron mobility transistor (HEMT) according to the present invention. The HEMT comprises a semiinsulating GaAs substrate 11, an undoped (intrinsic) channel layer 12 made of a III-V family compound semiconductor, a doped carrier supplying layer 13 made of an n-type II-VI family compound semiconductor, a drain electrode 15, and a gate electrode 16. The source electrode 14 comprises a metallized region 14A, and the drain electrode 15 has a metallized region 15A. A two dimensional electron gas layer (hereinafter simply referred to as a 2DEG layer) 17 is formed in a vicinity of a hetero interface on the side of the channel layer 12.

Compared to the II-VI family compound semiconductor, the III-V family compound semiconductor has a large electron affinity and a large carrier mobility, but a small energy band gap. Further, the energy difference between the conduction bands of the channel layer 12 and the carrier supplying layer 13 is large. Thus, even when a large voltage is applied across the drain electrode 15 and the source electrode 14, the carriers in the 2DEG layer 17 will not move into the carrier supplying layer 13, and it is possible to accumulate the high density two dimensional carrier gas in the 2DEG layer 17.

Hence, in the present embodiment, the channel layer 12 is made of undoped III-V family compound semiconductor, and the carrier supplying layer 13 is made of doped II-VI family compound semiconductor having a small electron affinity compared to that of the channel layer 12 and a large energy band gap compared to that of the channel layer 12. As a result, even when a large voltage is applied across the drain electrode 15 and the source electrode 14, the carriers in the 2DEG layer 17 will not move into the carrier supplying layer 13, and the operation of the HEMT is stable. In addition, since the density of the two dimensional carrier gas in the 2DEG layer 17 increases, it is possible to obtain a large current.

In a best mode of the present embodiment, undoped gallium arsenide (GaAs) is used for the channel layer 12 and n-type cadmium zinc sulfide $Cd_{0.43}Zn_{0.57}S$ doped with silicon (Si) is used for the carrier supplying layer 13. For example, the undoped GaAs channel layer 12 has a film thickness of 5000Å, and the n-type $Cd_{0.43}Zn_{0.57}S$ carrier supplying layer 13 has a film thickness of 500Å. The source electrode 14 and the drain electrode 15 are formed from gold germanium (AuGe) to a film thickness of 300Å or from gold (Au) to a film thickness of 3000Å. The gate electrode 16 is formed from aluminum (Al) to a thickness of 3000Å. According to this best mode of the present embodiment, the energy difference between the conduction bands of the undoped GaAs channel layer 12 and the n-type $Cd_{0.43}Zn_{0.57}S$ carrier supplying layer 13 is extremely large, and a satisfactory lattice matching is obtained between the undoped GaAs channel layer 12 and the n-type $Cd_{0.43}Zn_{0.57}S$ carrier supplying layer 13.

FIG. 2 is an energy band diagram for the best mode of the present embodiment. In FIG. 2, those parts which are the same as those corresponding parts in FIG. 1 are designated by the same reference numerals. In FIG. 2, $E_F$ denotes the Fermi level, $E_C$ denotes the bottom of the conduction band, $E_V$ denotes the top of the valence band, $B_C$ denotes the energy difference between the conduction bands of the channel layer 12 and the carrier supplying layer 13, G2 denotes the width of the forbidden band of the channel layer 12 and G3 denotes the width of the forbidden band of the carrier supplying layer 13.

In the best mode of the present embodiment, $B_C=0.7$ eV, $B_V=1.02$ eV, $G2=1.42$ eV and $G3=3.14$ eV. The value 0.7 eV for the energy difference $B_C$ is approximately three to four times that obtainable in the conventional HEMT described before. Since the energy difference $B_C$ is large, the carriers in the 2DEG layer 17 will not move into the carrier supplying layer 13 even when a large voltage is applied across the drain electrode 15 and the source electrode 14. Furthermore, because of the large energy difference $B_C$, a density $N_S$ of the two dimensional carrier gas in the 2DEG layer 17 is approximately $4 \times 10^{12}$ cm$^{-2}$ which is approximately four times the density obtainable in the conventional HEMT described before.

FIG. 3 is a graph of drain-source voltage $V_{DS}$ versus drain-source current $I_{DS}$ characteristic of the best mode of the present embodiment. In FIG. 3, the ordinate denotes the drain-source current $I_{DS}$, and the abscissa denotes the drain-source voltage $V_{DS}$. In FIG. 3, the characteristic of the best mode of the present embodiment is indicated by a solid line, and for the purpose of comparison, the characteristic of the conventional HEMT using undoped GaAs as the channel layer and doped $Al_{0.3}Ga_{0.7}As$ as the carrier supplying layer is indicated by a phantom line.

It may be seen from the phantom line in FIG. 3 that the drain-source current $I_{DS}$ decreases when the drain-source voltage $V_{DS}$ exceeds 5 V in the case of the conventional HEMT. But according to the best mode of the present invention, it may be seen from the solid line in FIG. 3 that the drain-source current $I_{DS}$ does not decrease even when the drain-source voltage $V_{DS}$ reaches 10 V. The data shown in FIG. 3 are obtained when the length of the gate is 0.5 μm, the width of the gate is 200 μm, and the gate voltage is set 0.8 V higher than a threshold voltage which makes the drain-source current $I_{DS}$ zero.

The formation of the channel layer 12 and the carrier supplying layer 13 can be carried out with ease. For example, the undoped GaAs channel layer 12 may be formed by a metal organic chemical vapor deposition (hereinafter simply referred to as MOCVD) by using trimethyl gallium (TMG: $(CH_3)_3Ga$) and arsine ($AsH_3$) as the source gas, and the doped CdZnS carrier supplying layer 13 can be formed by a MOCVD using dimethyl cadmium (DMC: $(CH_3)_2Cd$), dimethyl zinc (DMZ: $(CH_3)_2Zn$) and hydrogen sulfide ($H_2S$) as the source gas.

According to the best mode of the present embodiment, because the undoped channel layer 12 is a two-element layer (i.e. GaAs), the carrier mobility therein is quite high. Furthermore, the energy difference between the conduction bands of the carrier supplying layer and the channel layer is so large that such high mobility carriers are effectively prevented from transferring from the channel layer to the carrier supplying layer. Such effect of preventing the real space carrier transfer to carrier supplying layer is much larger than that obtainable in the previously proposed HEMT described before using the three-element or four-element layer as the channel layer. Consequently, from the total point of view, the carrier mobility μ is sufficiently high in the present embodiment.

Further, the present invention is not limited to these embodiments, but various variations and modifications may be made without departing from the scope of the present invention.

What is claimed is:

1. A high electron mobility transistor comprising:
   a semiinsulating substrate;
   an undoped channel layer having an electron affinity, an energy gap and being formed on said semiinsulating substrate, said channel layer comprising an undoped III-IV family compound;
   a doped carrier supplying layer formed on said undoped channel layer, said doped carrier supplying layer comprising doped cadmium zinc sulfide (CdZnS) which forms a lattice matching layer with said undoped channel layer an has an electron affinity smaller than that of said undoped channel layer and an energy gap greater than that of said undoped channel layer; and
   source, drain and gate electrodes formed on said doped carrier supplying layer.

2. A high electron mobility transistor as claimed in claim 1, wherein said doped cadmium zinc sulfate comprises doped cadmium zinc sulfide ($Cd_{0.43}Zn_{0.57}S$) which forms a lattice matching layer with said undoped channel layer.

3. A high electron mobility transistor as claimed in claim 1 wherein said undoped channel layer and said doped carrier supplying layer have respective conduction bonds, and wherein an energy difference between the conduction band of said undoped channel layer and the conduction band of said doped carrier supplying layer is approximately in the order of 0.7 eV.

4. A high electron mobility transistor as claimed in claim 1 includes a two dimensional carrier gas in a two dimensional electron gas layer formed in a vicinity of a hereto interface between said undoped channel layer and said doped carrier supplying layer, said two dimensional carrier gas having a density approximately in the order of $4 \times 10^{12}$ $cm^{-2}$.

* * * * *

UNITED STATES PATENT AND TRADEMARK OFFICE
CERTIFICATE OF CORRECTION

PATENT NO. : 4,958,203
DATED : September 18, 1990
INVENTOR(S) : Masahiko Takikawa It is certified that error appears in the above-identified patent and that said Letters Patent is hereby corrected as shown below:

Col. 6, (claim 2), line 2, "sulfate" should be --sulfide--;

Col. 6, (claim 3), line 4, "bonds" should be --bands--.

Signed and Sealed this

Third Day of December, 1991

*Attest:*

HARRY F. MANBECK, JR.

*Attesting Officer*      *Commissioner of Patents and Trademarks*